United States Patent [19]
Yu

[11] Patent Number: 5,364,709
[45] Date of Patent: Nov. 15, 1994

[54] INSULATION FOR SUPERCONDUCTORS

[75] Inventor: Dingan Yu, Shrewsbury, Mass.

[73] Assignee: Composite Materials Technology, Inc., Shrewsbury, Mass.

[21] Appl. No.: 980,770

[22] Filed: Nov. 24, 1992

[51] Int. Cl.⁵ .................... H01B 12/08; H01B 12/10; H01L 39/12; H01L 39/24

[52] U.S. Cl. .................... 428/662; 428/660; 428/930; 29/599; 505/814; 505/887

[58] Field of Search .............. 428/614, 661, 662, 663, 428/629, 930; 505/812, 813, 814, 886, 887; 148/98; 29/599; 174/125.1

[56] References Cited

U.S. PATENT DOCUMENTS

| | | | |
|---|---|---|---|
| 3,218,693 | 7/1962 | Allen et al. | 29/155.5 |
| 3,408,235 | 10/1967 | Berghout et al. | 148/6.3 |
| 3,465,430 | 1/1967 | Barber et al. | 29/599 |
| 3,509,622 | 5/1970 | Bernert et al. | 29/599 |
| 3,514,850 | 6/1970 | Barber et al. | 29/599 |
| 3,567,407 | 3/1971 | Yoblin | 29/191.4 |
| 3,618,205 | 11/1971 | Barber et al. | 29/599 |
| 3,625,662 | 3/1972 | Roberts | 29/191.6 |
| 3,698,863 | 10/1972 | Roberts et al. | 29/183.5 |
| 3,813,764 | 6/1974 | Tanaka et al. | 29/599 |
| 3,983,521 | 9/1976 | Furuto et al. | 174/125.1 |
| 4,053,976 | 10/1977 | Scanlan et al. | 29/599 |
| 4,073,666 | 2/1978 | Marancik et al. | 29/599 |
| 4,094,060 | 6/1978 | Madsen et al. | 29/599 |
| 4,205,119 | 5/1980 | Young et al. | 174/125.1 |
| 4,262,412 | 4/1981 | McDonald | 29/599 |
| 4,330,347 | 5/1982 | Hirayama | 148/31.5 |
| 4,414,428 | 11/1983 | McDonald | 174/126 S |
| 4,531,982 | 6/1985 | Dubots | 29/599 |
| 4,752,654 | 6/1988 | Iida et al. | 174/125.1 |
| 4,925,741 | 5/1990 | Wong | 428/661 |
| 4,973,365 | 11/1990 | Ozeryansky et al. | 148/11.5 |
| 4,990,491 | 2/1991 | Wagner et al. | 505/1 |

FOREIGN PATENT DOCUMENTS

| | | | |
|---|---|---|---|
| 4-4519 | 1/1992 | Japan | 505/813 |
| 1178116 | 1/1970 | United Kingdom | H01V 11/00 |

OTHER PUBLICATIONS

"Cuprous Sulfide as a Film Insulation" by Wagner et al ICMC Conference 1981 vol. 28 pp. 1–10.

A.C. "Losses in Multifilamentary Composite Superconducting Strands and Cables" by Mower and Iwasa Advances in Cryogenic Engineering Material, vol. 32, Ed. 6 of R. P. Reed and A. F. Clark, Pienum Press, New York, 1986 pp. 771–778.

Development of a New Technique For Applying A Metallic Surface Coating on ITER Nb3Sn Wire to Replace Hard Chromium Plating, A revised Proposal to MIT Plasma Fusion Center, Aug. 1992.

Primary Examiner—John Zimmerman
Attorney, Agent, or Firm—Hayes, Soloway, Hennessey, Grossman & Hage

[57] ABSTRACT

A superconducting article has a matrix core containing a superconductor, a copper stabilizer layer disposed about the core, and an insulating layer surrounding the copper stabilizer layer. The insulating layer is a metallurgically bonded layer of a refractory metal selected from Nb, Ta, V, and Mo.

7 Claims, 1 Drawing Sheet

INSULATION FOR SUPERCONDUCTORS

This invention relates to the insulation of superconductor strands for the reduction of a.c. losses caused in inter-strand coupling.

BACKGROUND OF THE INVENTION

In the operation of a.c. superconducting magnets formed from cabled superconducting wires, energy losses due to coupling can be a major problem. Coupling is essentially a short-circuit between adjacent strands in a cable, caused by insufficient resistance at the interfaces of the strands. Induced currents flow across the interfaces of coupled strands, dissipating energy.

For $Nb_3Sn$ cables, which must be reacted after magnet winding due to the brittleness of the $Nb_3Sn$ intermetallic, coupling can be a particularly acute problem. $Nb_3Sn$ strands usually have a copper surface. Since the reaction temperature is in the 700° C. range, the $Nb_3Sn$ strands tend to sinter together, coupling in a literal sense. This is especially true then, as is often the case, the conductor is cable-in-conduit (CIC). In this configuration, the cable is sealed within a jacket, usually a stainless steel jacket. This jacket presses in on the cable, forcing the strands together. Between the temperature and the pressure, some sintering of the strands is inevitable.

The sintering and coupling problem has been recognized for some time, and several approaches have been taken to remedy it. In U.S. Pat. No. 4,330,347, Hirayama et al disclose a method by which to create an insulating layer on the copper surface of a conductor (see also "Cuprous Sulfide as a Film Insulation for Superconductors", G. R. Wagner, P. D. Vecchio, and J. H. Uphoff, *Advances in Cryogenic Engineering (materials)*, Vol. 28, 1981). The conductor strand is baked in $H_2S$ gas to create a thin (1.5–20 µm) cuprous sulfide coating. An important feature of the invention is that no reduction in the conductivity of the copper occurs as a result of the sulfiding process (other than in the coating itself). The coating prevents sintering for 700° C. temperatures held for as long as 30 hours. Inter-strand coupling is prevented by the coating up to a certain breakdown voltage. When this voltage is exceeded, the semiconducting coating freely passes current. Unlike the invention that forms the subject of this application, the cuprous sulfide insulator involves conversion of the copper conductor surface rather than the development of a distinctly separate metal coating.

In U.S. Pat. No. 4,990,491, Wagner et al. disclose a method by which to produce an insulating nickel oxide coating on a conductor strand surface. Nickel is plated onto the conductor and the conductor is then heated in an oxygen-rich atmosphere. The resulting coating has properties similar to cuprous sulfide but provides a much higher voltage stand-off and so is a more effective insulator. The patent states that no conductivity degradation occurs in the copper cladding of the strand as a result of nickel contamination for heat treatments of 700° C. for more than 30 hours. Still, this is clearly a potential problem, as anyone knowledgeable in the art will understand. No metals other than nickel are disclosed as possible coating materials.

Another method by which to prevent inter-strand sintering for $Nb_3Sn$ conductors is to plate chromium onto the strand surface. This is the method most commonly utilized in today's industry for large-scale projects like the proposed International Thermonuclear Experimental Reactor (ITER). Chromium plating does effectively prevent sintering and largely eliminates coupling (see, for example, "A.C. Losses in Multifilamentary Composite Superconducting Strands and Cables", T. M. Mower and Y. Iwasa, *Advances in Cryogenic Engineering (Materials)*, Vol. 32, Edited by R. P. Reed and A. F. Clark, pp. 771–778, Plenum Press, New York, 1986), but the process has several drawbacks, including the following:

1. It is an expensive process.
2. It is difficult to plate the chromium consistently over long lengths of strand.
3. The bond of the plated chromium to the surface of the strand is often weak, resulting in flaking of the chromium during cabling operations.
4. The hard chromium is poorly suited to the sharp bending involved in cabling.
5. The copper and chromium can inter-diffuse during heat treatment, causing degradation of the copper conductivity and thereby undermining the electrical stability of the conductor.

A method for producing an insulating coating that is not subject to such problems and does not require special sulfiding or oxidizing steps would be of great use to industry. Such a method forms the subject of the present invention.

All of the above coating techniques, and the present invention as well, apply most particularly to $Nb_3Sn$ conductors. The prior art contains numerous descriptions of fabrication methods for $Nb_3Sn$ conductors. Examples include McDonald, U.S. Pat. No. 4,262,412, and Ozeryansky et al, U.S. Pat. No. 4,973,365. These patents disclose $Nb_3Sn$ conductor fabrication by the bronze route and by the internal tin process, respectively.

Although the invention is most effective for cabled $Nb_3Sn$ conductors, it may be applied to other conductors with equal ease. Cables utilizing NbTi conductor strands, for example, can also suffer coupling losses during a.c. operation, even though sintering is not a problem. The invention could be applied to increase the inter-strand resistance in such cable and thereby reduce the losses. That $Nb_3Sn$ conductors are presented as the exemplar in the following discussion should therefore not be interpreted as a restriction upon the type of conductors to which the invention is applicable.

BRIEF DESCRIPTION OF THE INVENTION

The product of the present invention is a superconductor strand having a surface coating of a ductile, electrically resistive metal that is substantially insoluble in copper at temperatures near 700° C. and possesses a high melting point relative to copper. The metals niobium, vanadium, tantalum, and molybdenum are preferred. The invention is practiced by surrounding the body of the conductor with sheets of the chosen cladding material along with such barrier materials and/or extrusion jacket materials as may be required by the application. An essential feature of the invention is that these steps are undertaken in the course of conductor fabrication by means that do not require extraordinary modification to the fabrication protocols.

The cladding and conductor assembly form a billet that is then mechanically reduced in diameter to a final size where the cladding thickness is less than 20 µm. Any external can materials and/or barrier materials are chemically removed at this point to reveal the clad surface of the conductor. Alternatively, the jacket or barrier materials may be removed at an intermediate processing stage so as to reveal a surface suitable for wire drawing, be it the cladding itself or some buffer layer. In either case, only the cladding surface remains upon completion of processing.

The cladding is resistive at cryogenic temperatures, does not sinter to itself at temperatures near 700° C., and is substantially insoluble in copper at these same temperatures. Unlike plated coatings such as chromium, the cladding in the present invention is metallurgically bonded to the conductor and is readily deformable. When the strands are cabled, the cladding prevents inter-strand sintering and minimized coupling losses during a.c. operation. In order to more fully understand the invention, reference should be had to the following detailed description taken in conjunction with the attached drawing, wherein:

DETAILED DESCRIPTION OF THE INVENTION

Figure 1:
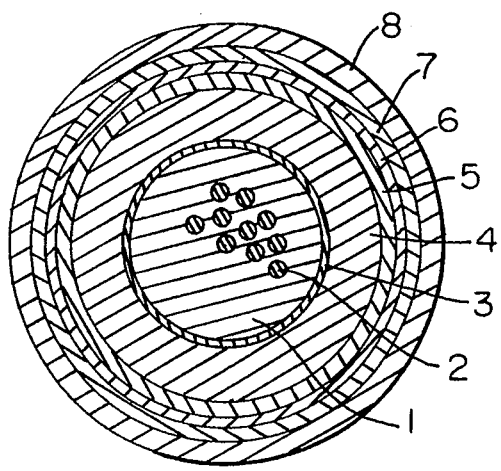
FIG. 1 is a schematic cross-sectional view of a bronze route $Nb_3Sn$ conductor billet containing the outer metal layers characteristic of the invention.

A preferred embodiment of the invention is shown in FIG. 1. A bronze (e.g., Cu—Sn) matrix 1 contains a plurality of niobium filaments 2. The matrix is surrounded by a tantalum barrier 3, and a copper stabilizer 4. The features 1-4 are typical for a bronze route $Nb_3SN$ superconductor strand. The remaining features are characteristic of the invention. The niobium cladding 5 is the insulating surface to eventually be exposed by chemical means. A thin iron layer 6 is provided for a drawing surface. A titanium etching barrier 7 is incorporated to separate the copper extrusion jacket 8 and the iron drawing surface 6. In most cases, the cladding and barriers 5, 6, 7 will be incorporated as one or more turns of sheet material for each component.

The multiple parts of the composite are assembled into a billet which is then reduced by any of a number of mechanical means, but preferably by hot extrusion and wire drawing. After extrusion, but prior to final size, the copper jacket is removed in nitric acid and the titanium barrier is removed in hydrofluoric acid. The thin iron layer is then utilized as the outer wire drawing surface. The thinness of the iron allows almost direct drawing of the niobium cladding. A niobium surface can be drawn directly, but only with great difficulty and at high cost. The iron layer thus simplifies the wire drawing process. When the wire has been reduced to the desired diameter, the iron surface is removed in hydrochloric acid, which affects neither the niobium nor any copper which might inadvertently be exposed through defects in the niobium cladding. The final strand possesses only the features 1-5 in FIG. 1.

Figure 2:
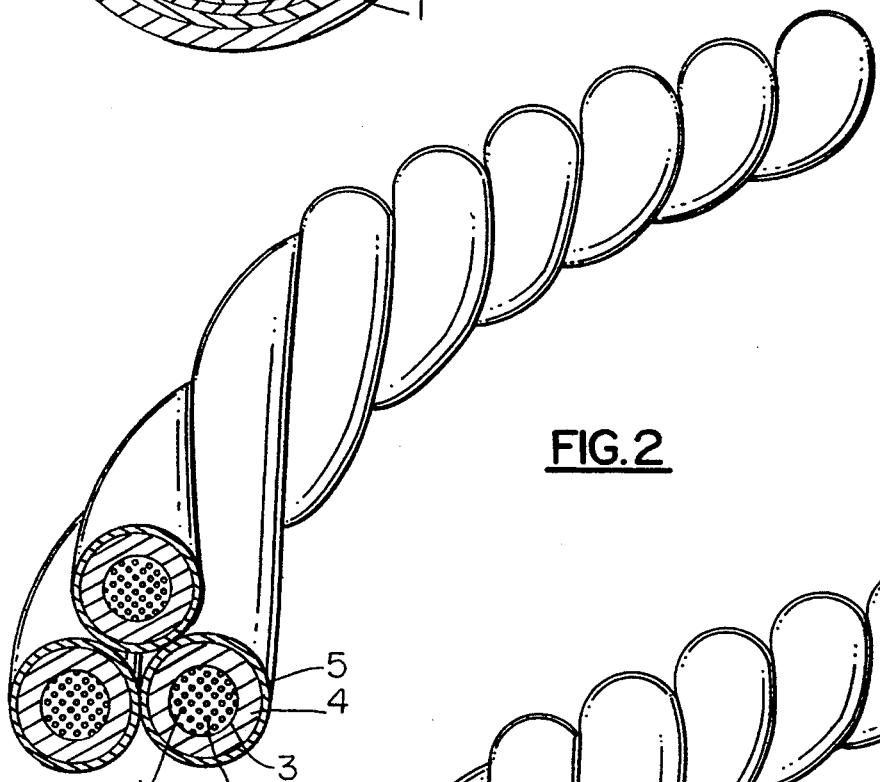
FIG. 2 is a schematic rendering of a bronze route cable consisting of three conductor strands twisted together. The features 1-5 of FIG. 1, greatly reduced in size at the final strand diameter, are indicated for clarity.

FIG. 2 shows a simple cable made from bronze route conductor strand as described above. In order to form the superconducting $Nb_3Sn$ intermetallic, such a cable is heated at temperatures near 700° C. for 30 hours or more. The intermetallic forms as a result of reaction between the niobium filaments 2 and the bronze matrix 1. The tantalum barrier 3 prevents tin from leaching out of the bronze and into the copper stabilizer 4. It is important to realize that the electrical stability of such a conductor depends entirely upon the purity of the copper stabilizer. This is why the bronze matrix itself cannot serve as a stabilizer, despite the fact that much of the tin is drawn out of the matrix to form the compound; the remaining "copper" is really only low-tin bronze. A matrix containing 7 at.% tin prior to reaction, for example, will usually still contain 2-3 at.%tin after reaction, far too much to make it useful as a stabilizer.

A tin-containing copper matrix will have a relatively low (e.g. 30 or less) "resistance ratio", i.e. the ratio of room temperature to resistance of 4.2° K. With pure high conductivity copper, its resistance ratio is on the order of 250 or above.

The melting points of niobium and other metals appropriate to the to the cladding, such as tantalum, vanadium, and molybdenum, are above 1900° C., and so are unlikely to sinter when the cable is heat treated at temperatures near 700° C. Furthermore, little or no interdiffusion will occur between the copper stabilizer and cladding materials of this type. Niobium and tantalum, in particular, are wholly insoluble in copper. The reverse is also true. The use of these metals ensures that the purity of the copper is maintained, guaranteeing that its conductivity remains sufficiently high to stabilize the superconductor.

Unlike hard chromium, the cladding of the present invention is metallurgically bonded to the conductor, so no flaking can occur. The cladding is ductile, and so is well suited to cabling operations. The method also ensures a much more uniform coating than can be provided by plating.

The thicknesses of the cladding, barriers, and outer jacket will depend upon the needs of the application. Typically, however, the iron will have a thickness comparable to the niobium and the niobium will be chosen so as to have a thickness under 20 $\mu$m at the final conductor diameter. The titanium thickness and the thickness of the outer jacket may be arbitrarily chosen, inasmuch as these layers are removed in the early stages of processing. A possible combination of layer thicknesses for a given billet diameter is given in the following non-limiting example:

EXAMPLE I

A bronze route $Nb_3Sn$ conductor billet comprising the elements 1-4 of FIG. 1 is assembled as is well known in the art. The outer diameter of the stabilizer can 4 is 5,670". The niobium layer 5 is composed of three turns of niobium foil 0.005" thick. The iron layer 6 is composed of three turns of iron foil 0.005" thick. The titanium layer 7 is composed of three turns of titanium sheet 0.020" thick. The niobium and iron foils and the titanium sheet are preferably in annealed condition. The iron foil is preferably of greater than 99% purity. The titanium sheet preferably conforms to ASTM B265-79 Grade 1. The copper jacket 8 has an internal diameter of 5.88" and an external diameter of 6.050".

The assembled billet is welded shut, hot isostatically pressed (HIP'd), and extruded in a manner well known in the art. After extrusion, the copper jacket is pickled off in nitric acid and the titanium barrier is pickled off in hydrofluoric acid. The iron clad rod is then reduced by a series of wire drawing and annealing steps as is well known in the art. At a final diameter of 0.031", the iron surface of the wire is pickled off in hydrochloric acid, revealing the niobium-clad conductor at a diameter of 0.0308", a size well suited to applications such as ITER. The niobium thickness at this diameter is about 2 m, sufficient to prevent sintering and minimize inter-strand coupling as a result of reaction of the Nb$_3$Sn cable.

It will be observed by those knowledgeable in the art that metals such as niobium (critical temperature, $T_c=9.3°$ K.), tantalum ($T_c=4.5°$ K.), and vanadium ($T_c=5.3°$ K.) are superconducting at the 4.2° K. operating temperature typically used for Nb$_3$Sn conductors. However, such metals are superconducting over only a very narrow magnetic field range (<1 T) relative to the full operating range of a Nb$_3$Sn a.c. magnet (−13 T maximum for ITER). In addition, the current carrying capacity ($J_c$) of these metals is very low, as evidenced by the fact that they are never used as bulk superconductors in modern industry. Since the coatings are subjected to 700° C. temperatures for many hours, any cold work imparted to them is substantially eliminated, further reducing $J_c$. Add the contact resistance expected between the unsintered strands, and coupling losses due to the weak superconductivity of these metal coatings become trivial. Hysteresis losses, though present, will also be negligibly small.

The preferred embodiment of the invention may be modified in a number of ways that will be obvious to those knowledgeable in the art. For example, the barrier/buffer components (6 and 7 in FIG. 1) could be eliminated. At some stage in the drawing, or at final size, the outer jacket could be pickled off in nitric acid, revealing the niobium-clad conductor. It is not recommended to draw the composite to final size with the jacket in place because the niobium will tend to develop small holes through which the nitric acid can attack the underlying stabilizer. Removing the jacket when the niobium is relatively thick (>0.001") and then drawing with the niobium surface exposed is feasible but, as has been pointed out, it is difficult and costly. The same is true for vanadium-, tantalum-, and molybdenum-clad materials. Nonetheless, such a process falls within the scope of the invention.

In another embodiment wherein elements 6 and 7 of FIG. 1 are eliminated, the jacket 8 is made of iron or an iron alloy such as steel. In this embodiment, the extruded rod is simply drawn to final size, whereupon the jacket is pickled off in hydrochloric acid. Holes may appear in the niobium during drawing, as described above, but holes are not necessarily a problem in this case. The hydrochloric acid will attack neither the niobium nor the copper stabilizer, so the conductor will not be damaged during pickling. Occasional small bare spots in the niobium should not cause significant sintering or coupling problems.

In another embodiment, the drawing surface 6 is not pure iron, but an iron alloy, such as steel, or any other ductile metal consistent with the selective etching process.

In still another embodiment, the extrusion jacket 8 is made of a ductile metal other than copper. Any metal that is soluble in nitric acid, such as nickel, is suitable.

In yet another embodiment, the surface of the final clad conductor may be treated so as to enhance its resistivity. For example, the product of the preferred embodiment, having been wound into a cable, could be heated in an oxygen-rich environment so as to promote the formation of a niobium oxide surface layer on the conductor. The heat treatment should be consistent with Nb$_3$Sn formation within the conductor (700° C. temperature, e.g.). A NbO layer would have higher resistivity than niobium and would not superconduct as niobium does.

Figure 3:
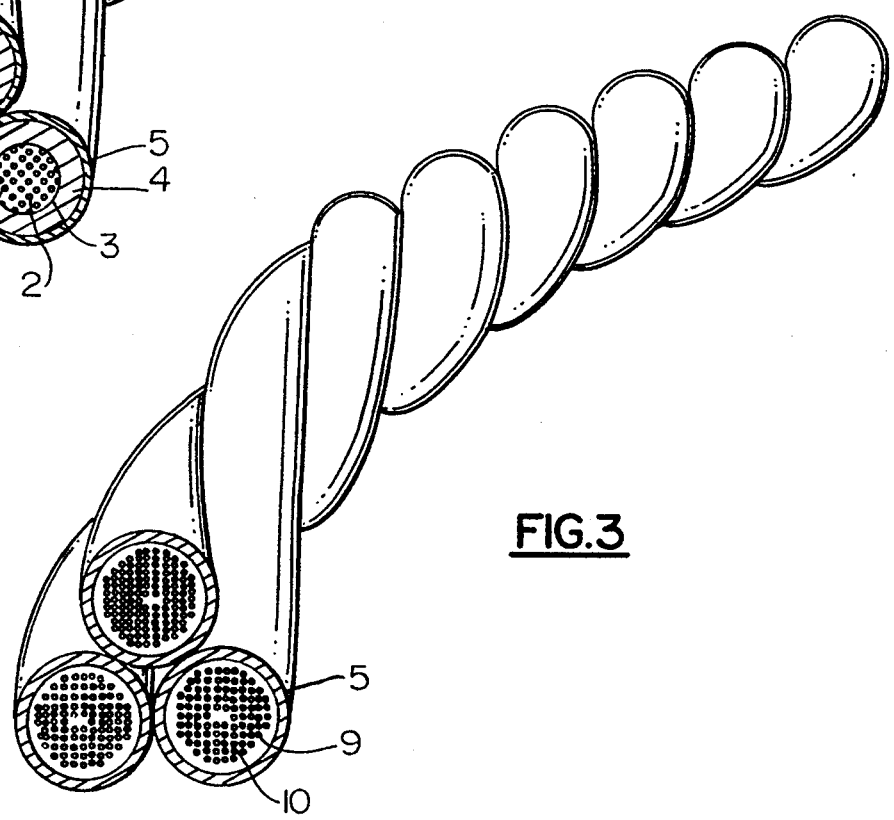
FIG. 3 is a schematic rendering of a NbTi cable consisting of three conductor strands twisted together. Each strand possesses the resistive cladding characteristic of the invention.

It is also possible to apply the invention to other conductors. FIG. 3 shows a simple cable consisting of three conductor strands twisted together. Instead of the bronze route conductor shown in FIG. 2, the conductor here consists of a plurality of NbTi filaments 9 in a copper matrix 10. Each strand is surrounded by cladding material 5, which is preferably niobium tantalum, vanadium, or molybdenum.

The clad NbTi conductor strand is formed by assembling a multifilament NbTi billet in a manner well known in the art. This billet is surrounded by cladding, barrier materials, and an extrusion jacket exactly as described in Example I. It is then welded, HIP'd, and hot extruded. The jacket and barriers are removed from the extruded rod as described in Example I. The rod is then reduced in a series of wire drawing and precipitation heat treatment steps in a manner that is also well known in the art. At final size, the clad conductor is exposed as described in Example I. The cladding conductor is less than 20 μm thick at the final size. Cables made with the clad strand will have reduced coupling losses due to the enhanced inter-strand resistance provided by the cladding.

While the insulating layer has been described as a continuous layer, this is not critical. The important feature is that the insulating layer prevent contact between the stabilizer layers on the superconductors strands. Thus some porosity can be tolerated so long as this physical spacing is achieved.

I claim:

1. The process of forming a superconducting article comprising a matrix core containing a superconductor, a pure metallic stabilizer layer disposed about said core, and an insulating layer surrounding said stabilizer layer which comprises the steps of providing a superconductor billet in a stabilizer can protected by a diffusion barrier between the superconductor billet and the stabilizer can, surrounding the stabilizer can with an insulating refractory metal (including alloys thereof) which is unreactive with the stabilizer metal at 700° C. and is not superconducting at magnetic fields above 1 Tesla and at a temperature of 4.2° K., providing at least two additional metal layers outside said refractory metal layer to aid in wire drawing, the inner of said two additional layers comprising iron and the outer of said layers comprising copper, coreducing said layers to metallurgically bond said layers, removing said additional copper layer and further reducing said layers to a total reduction by a factor of at least 100 to create a final insulating refractory metal layer less than 20 μm thick and removing said iron layer.

2. The process of claim 1, wherein said superconductor is a bronze route billet containing Nb for forming a Nb$_3$Sn superconductor and said stabilizer is high conductivity copper.

3. The process of claim 1, wherein said superconductor is

4. The process of claim 1, wherein said insulating refractory metal layer is oxidized to produce an outer oxide coating.

5. The process of claim 1, wherein said superconductor is created by reacting tin with niobium.

6. The process of claim 1 wherein said insulating refractory metal layer is niobium and a titanium layer is positioned outside said iron layer.

7. An extrusion billet for forming a superconducting article comprising a matrix core containing a Nb$_3$Sn superconductor, said billet comprising a bronze core containing niobium dispersed therein, a pure copper stabilizer layer disposed about said core, and an insulating niobium layer surrounding said copper stabilizer layer, a tantalum layer surrounding said bronze billet, a high purity copper layer surrounding said tantalum layer, a niobium layer, an iron layer, a titanium layer and a copper extrusion layer in sequence outside said tantalum layer.

* * * * *

UNITED STATES PATENT AND TRADEMARK OFFICE
CERTIFICATE OF CORRECTION

PATENT NO. : 5,364,709
DATED : November 15, 1994
INVENTOR(S) : Dingan Yu

It is certified that error appears in the above-indentified patent and that said Letters Patent is hereby corrected as shown below:

Claim 3, Col. 6, Line 65, insert --NbTi.-- after "is".

Signed and Sealed this

Twenty-ninth Day of July, 1997

Attest:

BRUCE LEHMAN

*Attesting Officer*  *Commissioner of Patents and Trademarks*